(12) United States Patent
Seibel, II et al.

(10) Patent No.: US 8,906,263 B2
(45) Date of Patent: Dec. 9, 2014

(54) RED NITRIDE PHOSPHORS

(75) Inventors: Harry A. Seibel, II, Morrisville, NC (US); Brian Thomas Collins, Holly Springs, NC (US); David Todd Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 818 days.

(21) Appl. No.: 13/152,863

(22) Filed: Jun. 3, 2011

(65) Prior Publication Data

US 2012/0305958 A1 Dec. 6, 2012

(51) Int. Cl.
*H01L 33/50* (2010.01)
*C09K 11/77* (2006.01)
*C09K 11/08* (2006.01)

(52) U.S. Cl.
CPC ......... *C09K 11/7734* (2013.01); *C09K 11/0883* (2013.01)
USPC ........................ 252/301.4 F; 313/503; 257/98

(58) Field of Classification Search
USPC ........................ 252/301.4 F; 313/503; 257/98
See application file for complete search history.

(56) References Cited

U.S. PATENT DOCUMENTS

| | | | |
|---|---|---|---|
| 4,918,497 | A | 4/1990 | Edmond |
| 4,966,862 | A | 10/1990 | Edmond |
| 5,027,168 | A | 6/1991 | Edmond |
| 5,210,051 | A | 5/1993 | Carter |
| 5,338,944 | A | 8/1994 | Edmond et al. |
| 5,359,345 | A | 10/1994 | Hunter |
| 5,393,993 | A | 2/1995 | Edmond et al. |
| 5,416,342 | A | 5/1995 | Edmond et al. |
| 5,523,589 | A | 6/1996 | Edmond et al. |
| 5,604,135 | A | 2/1997 | Edmond |
| 5,631,190 | A | 5/1997 | Negley et al. |
| 5,739,554 | A | 4/1998 | Edmond et al. |
| 5,912,477 | A | 6/1999 | Negley |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,600,175 | B1 | 7/2003 | Baretz et al. |
| 6,791,119 | B2 | 9/2004 | Slater et al. |
| 6,853,010 | B2 | 2/2005 | Slater et al. |
| 6,958,497 | B2 | 10/2005 | Emerson et al. |
| 7,095,056 | B2 | 8/2006 | Vitta et al. |
| 7,213,940 | B1 | 5/2007 | Van de Ven et al. |
| 7,456,499 | B2 | 11/2008 | Loh et al. |
| 7,507,354 | B2 * | 3/2009 | Oshio ...................... 252/301.4 F |
| 7,564,180 | B2 | 7/2009 | Brandes |
| 1,272,039 | A1 | 3/2010 | Collins et al. |
| 2004/0256974 | A1 | 12/2004 | Mueller-Mach et al. |
| 2006/0221272 | A1 | 10/2006 | Negley et al. |
| 2007/0139923 | A1 | 6/2007 | Negley et al. |
| 2007/0158668 | A1 | 7/2007 | Tarsa et al. |
| 2007/0170447 | A1 | 7/2007 | Negley et al. |
| 2007/0223219 | A1 | 9/2007 | Medendorp et al. |
| 2007/0253209 | A1 | 11/2007 | Loh et al. |
| 2008/0012036 | A1 | 1/2008 | Loh et al. |
| 2008/0121921 | A1 | 5/2008 | Loh et al. |
| 2008/0173884 | A1 | 7/2008 | Chitnis et al. |
| 2008/0179611 | A1 | 7/2008 | Chitnis et al. |
| 2008/0198112 | A1 | 8/2008 | Roberts |
| 2008/0212305 | A1 * | 9/2008 | Kawana et al. .................. 362/84 |
| 2008/0258602 | A1 | 10/2008 | Masuda et al. |
| 2008/0283864 | A1 * | 11/2008 | LeToquin et al. ............. 257/101 |
| 2008/0303410 | A1 * | 12/2008 | Kaneda et al. ................ 313/503 |
| 2008/0308825 | A1 | 12/2008 | Chakraborty et al. |
| 2009/0050907 | A1 | 2/2009 | Yuan et al. |
| 2009/0050908 | A1 | 2/2009 | Yuan et al. |
| 2009/0080185 | A1 | 3/2009 | McMillan |
| 2009/0108281 | A1 | 4/2009 | Keller et al. |
| 2009/0184616 | A1 | 7/2009 | Van de Ven |
| 2009/0218581 | A1 | 9/2009 | Schmidt et al. |
| 2009/0243467 | A1 | 10/2009 | Shimizu et al. |
| 2009/0283721 | A1 | 11/2009 | Liu et al. |
| 2010/0123104 | A1 * | 5/2010 | Collins et al. .................. 252/586 |
| 2010/0164365 | A1 | 7/2010 | Yoshino et al. ............... 313/503 |
| 2010/0252851 | A1 | 10/2010 | Emerson et al. |
| 2010/0289044 | A1 | 11/2010 | Krames et al. |

FOREIGN PATENT DOCUMENTS

| | | | |
|---|---|---|---|
| EP | 2 060 616 A1 | 5/2009 | ............. C09K 11/78 |
| WO | WO 2007023439 A2 | 3/2007 | |

OTHER PUBLICATIONS

Watanabe et al, "Crystal structure and luminescence properties of SrxCa1-xAlSiN3:Eu2+ mixed nitride phosphors", Journ. Alloy and Compound, 475, Aug. 23, 2008, pp. 434-439.*
International Search Report and Written Opinion of the International Searching Authority for PCT/US2011/027362;p Date of Mailing: May 5, 2011; 16 pages.
Watanabe, Hiromu et al., "Crystal Structure and Luminescence Properties of $Sr_xCa_{1-x}AlSiN_3:Eu^{2+}$ Mixed Nitride Phosphors," *Journal of Alloys and Compounds* 475, (2009) pp. 434-439.
International Search Report and Written Opinion of the International Searching Authority for PCT/US2012/040071; Date of Mailing: Jul. 20, 2012; 8 pages.

* cited by examiner

*Primary Examiner* — Carol M Koslow
(74) *Attorney, Agent, or Firm* — Brinks Gilson & Lione

(57) ABSTRACT

Provided according to embodiments of the invention are phosphor compositions that include $Ca_{1-x-y}Sr_xEu_yAlSiN_3$, wherein x is in a range of 0.50 to 0.99 and y is less than 0.013. Also provided according to embodiments of the invention are phosphor compositions that include $Ca_{1-x-y}Sr_xEu_yAlSiN_3$, wherein x is in a range of 0.70 to 0.99 and y is in a range of 0.001 and 0.025. Also provided are methods of making phosphors and light emitting devices that include a phosphor composition according to an embodiment of the invention.

16 Claims, 12 Drawing Sheets

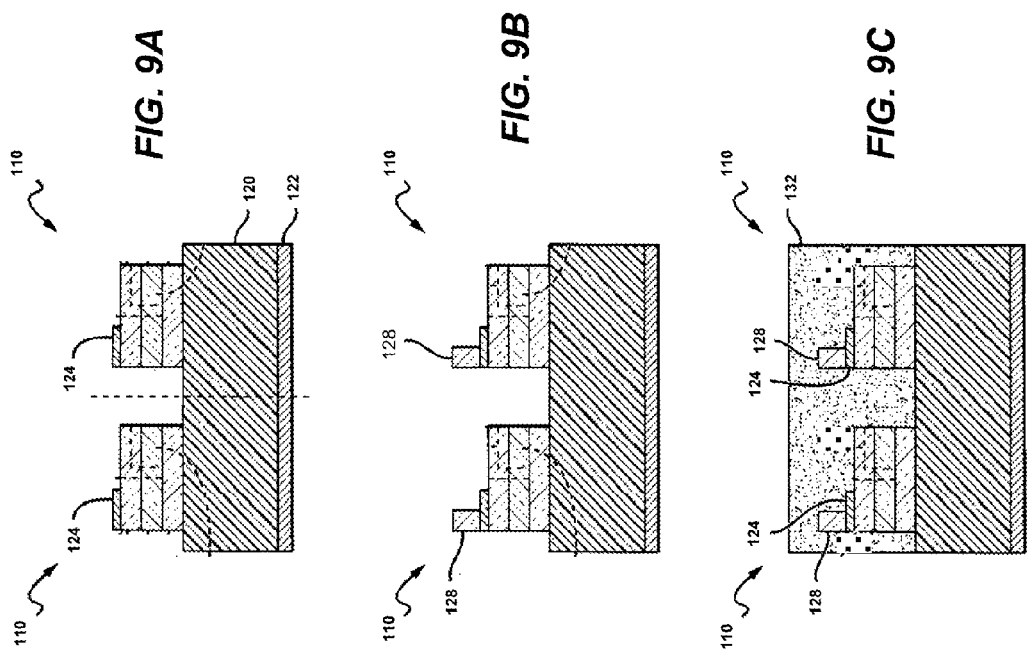

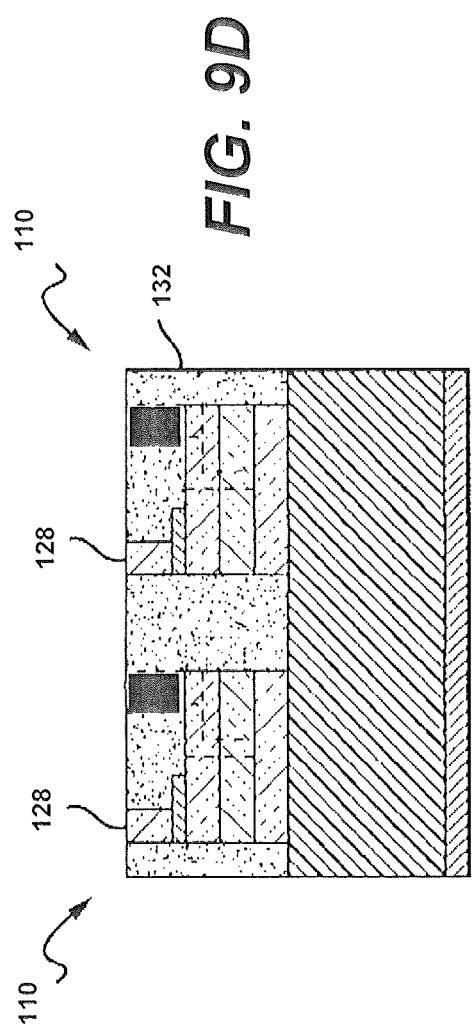
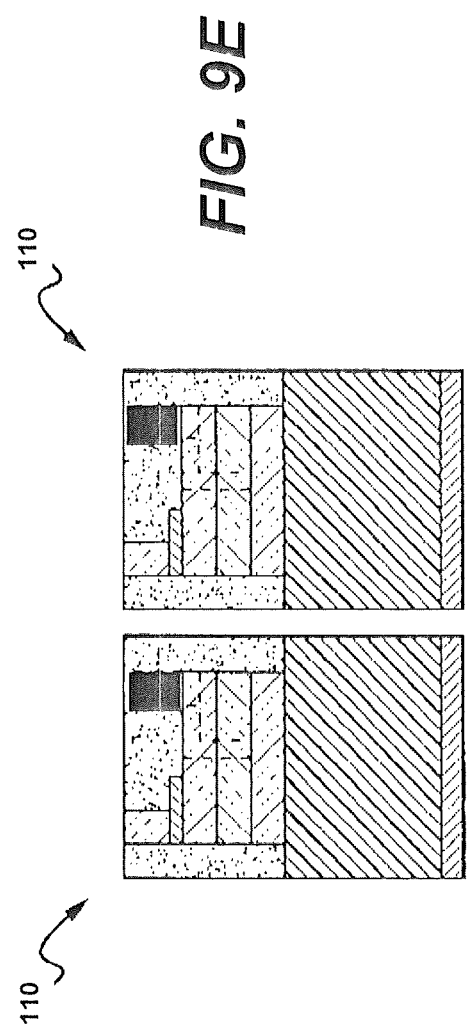
FIG. 9D
FIG. 9E

RED NITRIDE PHOSPHORS

FIELD OF THE INVENTION

The present invention relates phosphor compositions and to light emitting devices that include phosphor compositions.

BACKGROUND

Light emitting diodes ("LEDs") are well known solid state lighting devices that are capable of generating light. LEDs generally include a plurality of semiconductor layers that may be epitaxially grown on a semiconductor or non-semiconductor substrate such as, for example, sapphire, silicon, silicon carbide, gallium nitride or gallium arsenide substrates. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will "collide" with a hole and recombine. Each time this occurs, a photon of light is emitted, which is how LEDs generate light. The wavelength distribution of the light generated by an LED generally depends on the semiconductor materials used and the structure of the thin epitaxial layers that make up the "active region" of the device (i.e., the area where the electrons and holes recombine).

LEDs typically have a narrow wavelength distribution that is tightly centered about a "peak" wavelength (i.e., the single wavelength where the radiometric emission spectrum of the LED reaches its maximum as detected by a photo-detector). For example, the spectral power distributions of a typical LED may have a full width of, for example, about 10-30 nm, where the width is measured at half the maximum illumination (referred to as the full width half maximum or "FWHM" width). Accordingly, LEDs are often identified by their "peak" wavelength or, alternatively, by their "dominant" wavelength. The dominant wavelength of an LED is the wavelength of monochromatic light that has the same apparent color as the light emitted by the LED as perceived by the human eye. Thus, the dominant wavelength differs from the peak wavelength in that the dominant wavelength takes into account the sensitivity of the human eye to different wavelengths of light.

As most LEDs are almost monochromatic light sources that appear to emit light having a single color, LED lamps that include multiple LEDs that emit light of different colors have been used in order to provide solid state light emitting devices that generate white light. In these devices, the different colors of light emitted by the individual LED chips combine to produce a desired intensity and/or color of white light. For example, by simultaneously energizing red, green and blue light emitting LEDs, the resulting combined light may appear white, or nearly white, depending on the relative intensities of the source red, green and blue LEDs.

White light may also be produced by surrounding a single-color LED with a luminescent material that converts some of the light emitted by the LED to light of other colors. The combination of the light emitted by the single-color LED that passes through the wavelength conversion material along with the light of different colors that is emitted by the wavelength conversion material may produce a white or near-white light. For example, a single blue-emitting LED chip (e.g., made of indium gallium nitride and/or gallium nitride) may be used in combination with a yellow phosphor, polymer or dye such as for example, cerium-doped yttrium aluminum garnet (which has the chemical formula $Y_{3-x}Ce_xAl_5O_{12}$, and is commonly referred to as YAG:Ce), that "down-converts" the wavelength of some of the blue light emitted by the LED, changing its color to yellow. Blue LEDs made from indium gallium nitride exhibit high efficiency (e.g., external quantum efficiency as high as 60%). In a blue LED/yellow phosphor lamp, the blue LED chip produces an emission with a dominant wavelength of about 450-465 nanometers, and the phosphor produces yellow fluorescence with a peak wavelength of about 545-565 nanometers in response to the blue emission. Some of the blue light passes through the phosphor (and/or between the phosphor particles) without being down-converted, while a substantial portion of the light is absorbed by the phosphor, which becomes excited and emits yellow light (i.e., the blue light is down-converted to yellow light). The combination of blue light and yellow light may appear white to an observer. Such light is typically perceived as being cool white in color. In another approach, light from a violet or ultraviolet emitting LED may be converted to white light by surrounding the LED with multicolor phosphors or dyes. In either case, red-emitting phosphor particles (e.g., $(Ca_{1-x-y}Sr_xEu_y)AlSiN_3$ based phosphor) may also be added to improve the color rendering properties of the light, i.e., to make the light appear more "warm," particularly when the single color LED emits blue or ultraviolet light.

As noted above, phosphors are one known class of luminescent materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths.

LEDs are used in a host of applications including, for example, backlighting for liquid crystal displays, indicator lights, automotive headlights, flashlights, specialty lighting applications and even as replacements for conventional incandescent and/or fluorescent lighting in general lighting and illumination applications. In many of these applications, it may be desirable to provide a lighting source that generates light having specific properties.

SUMMARY

Provided according to some embodiments of the present invention are phosphor compositions that include $Ca_{1-x-y}Sr_xEu_yAlSiN_3$, wherein x is in a range of 0.50 to 0.99 and y is less than 0.013. Also provided according to embodiments of the invention are phosphor compositions that include $Ca_{1-x-y}Sr_xEu_yAlSiN_3$, wherein x is in a range of 0.70 to 0.99 and y is in a range of 0.001 and 0.025. In some embodiments of the invention, the Sr to Eu ratio in the phosphor composition is in a range of 25 to 300. In some embodiments of the present invention, the phosphor composition is present in particulate form and at least 95% of the particles are elongated. In some embodiments of the invention, the phosphor composition is present as particles having an average particle size in a range of 4 μm to 20 μm.

In some embodiments of the present invention, the phosphor composition includes at least 1% by weight of a silicon aluminum oxynitride, such as $Si_2Al_4O_4N_4$. In some embodiments, the phosphor composition is present as a single crystal.

In some embodiments of the present invention, the phosphor composition absorbs light at a wavelength in a range of 350 and 530 nm and emits peak frequencies at a wavelength in a range of 620 to 660 nm.

In some embodiments of the present invention, phosphor compositions include $Ca_{1-x-y}Sr_xEu_yAlSiN_3$ phosphor particles, wherein x<1 and y<1, and at least some of the $Ca_{1-x-y}Sr_xEu_yAlSiN_3$ phosphor particles are elongated. In some embodiments, x is in a range of 0.5 and 0.99 and y is in a range of 0.001 and 0.025. In some embodiments, 50% or more of the $Ca_{1-x-y}Sr_xEu_yAlSiN_3$ phosphor particles are elongated, in some embodiments, 75% or more of the $Ca_{1-x-y}Sr_xEu_yAlSiN_3$ phosphor particles are elongated, and in some embodiments, 95% or more of the $Ca_{1-x-y}Sr_xEu_yAlSiN_3$ phosphor particles are elongated.

Also provided according to embodiments of the present invention are light emitting devices that include a solid state lighting source; and a phosphor composition according to an embodiment of the invention. In some embodiments of the invention, the LED emits a warm white light having a correlated color temperature between about 2700K and 5400K. In some embodiments, the light emitting device has a CRI value of greater than 90. In some embodiments, the light emitting device also includes a green and/or yellow phosphor.

Also provided according to embodiments of the invention are methods of forming a phosphor composition. In some embodiments, the methods include mixing nitrides of calcium, strontium, aluminum and silicon with a europium source composition to form a precursor mixture, heating the precursor mixture to a temperature in a range of 1500 and 1800° C. in the presence of forming gas, in a refractory crucible, to produce a phosphor composition according to an embodiment of the invention.

In some embodiments of the invention, the precursor mixture is heated in a substantial absence of water and oxygen. In some embodiments of the invention, the refractory crucible is substantially inert in the presence of the forming gas mixture. In some embodiments, the forming gas dynamically flows around the refractory crucible. In some embodiments, the precursor mixture is heated at a first temperature for at least 0.5 hours, heated to a second temperature for at least 0.5 hours, and then heated to a third temperature for at least 0.5 hours. In particular embodiments, the first temperature is 800° C., the second temperature is 1200° C. and the third temperature is 1800° C.

BRIEF DESCRIPTION OF THE DRAWINGS

FIGS. 9A-9E are sectional views illustrating fabrication steps that may be used to apply a phosphor composition to an LED chip wafer according to embodiments of the present invention.

DETAILED DESCRIPTION OF EMBODIMENTS OF THE INVENTION

Figure 1:
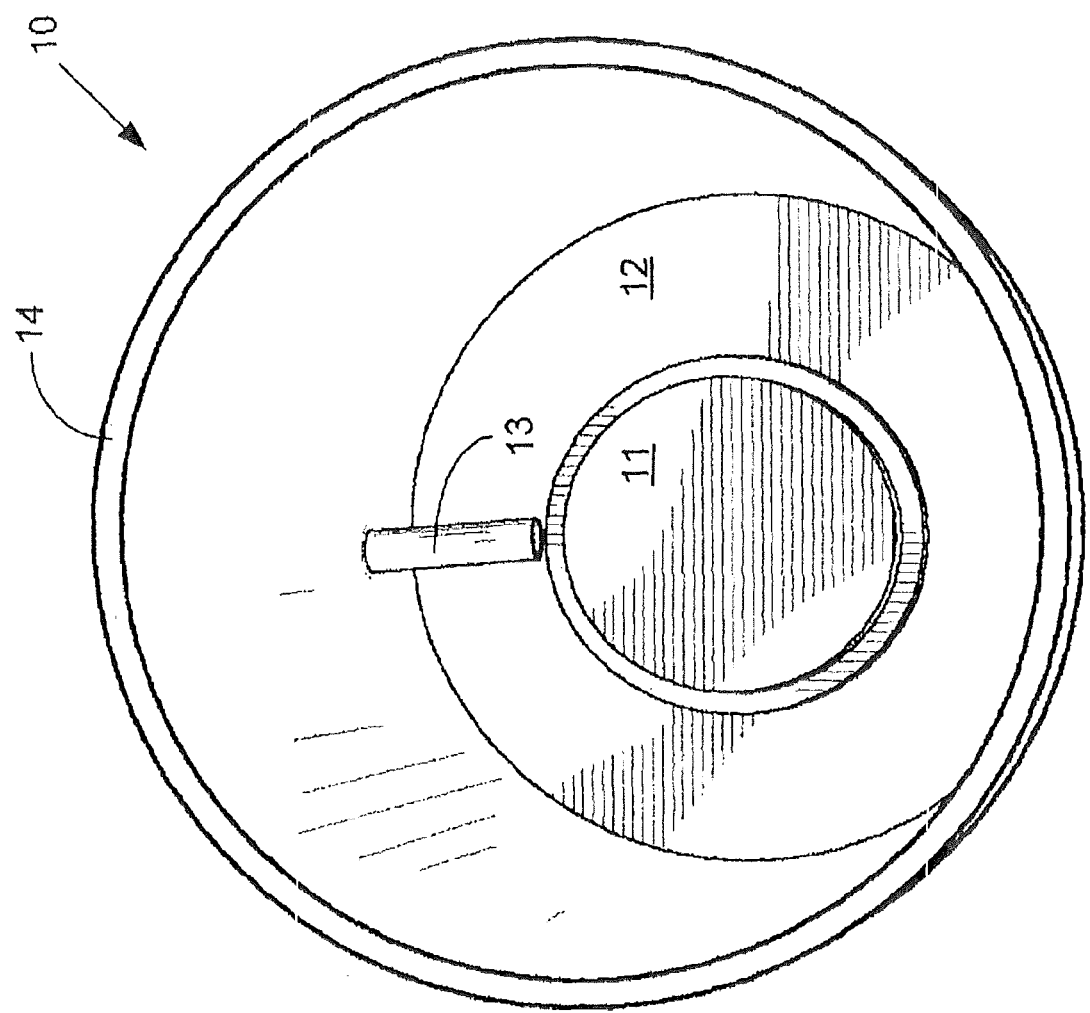
FIG. 1 is a top perspective of an apparatus that may be used to form a phosphor composition according to an embodiment of the invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms.

These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

All patents and patent applications referred to herein are incorporated by reference herein in their entirety. In case of conflicting terminology or scope, the present application is controlling.

As used herein, the term "solid state light emitting device" may include a light emitting diode, laser diode and/or other semiconductor device which includes one or more semiconductor layers, which may include silicon, silicon carbide, gallium nitride and/or other semiconductor materials, an optional substrate which may include sapphire, silicon, silicon carbide and/or other microelectronic substrates, and one or more contact layers which may include metal and/or other conductive materials. The design and fabrication of solid state light emitting devices are well known to those skilled in the art. The expression "light emitting device," as used herein, is not limited, except that it be a device that is capable of emitting light.

Solid state light emitting devices according to embodiments of the invention may include III-V nitride (e.g., gallium nitride) based LEDs or lasers fabricated on a silicon carbide or gallium nitride substrates such as those devices manufactured and sold by Cree, Inc. of Durham, N.C. Such LEDs and/or lasers may (or may not) be configured to operate such that light emission occurs through the substrate in a so-called "flip chip" orientation. Solid state light emitting devices according to embodiments of the present invention include both vertical devices with a cathode contact on one side of the chip, and an anode contact on an opposite side of the chip and devices in which both contacts are on the same side of the device. Some embodiments of the present invention may use solid state light emitting devices, device packages, fixtures, luminescent materials/elements, power supplies, control elements, and/or methods such as described in U.S. Pat. Nos. 7,564,180; 7,456,499; 7,213,940; 7,095,056; 6,958,497; 6,853,010; 6,791,119; 6,600,175; 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272.

Provided according to embodiments of the invention are phosphor compositions that include $Ca_{1-x-y}Sr_xEu_yAlSiN_3$, wherein x is in a range of 0.50 to 0.99 and y is less than 0.013. In particular embodiments of the invention, y is in a range of 0.001 to 0.013, and in particular embodiments, in a range of 0.001 to 0.012. Provided according to embodiments of the invention are phosphor compositions that include $Ca_{1-x-y}Sr_xEu_yAlSiN_3$, wherein x is in a range of 0.70 to 0.99 and y is in a range of 0.001 and 0.025. Furthermore, in some embodiments, x in a range of 0.71 to 0.99, and in particular embodiments, in a range of 0.70 to 0.90. In some embodiments of the invention, the Sr to Eu ratio in the phosphor composition is in a range of 25 to 300.

Although the $Ca_{1-x-y}Sr_xEu_yAlSiN_3$ may include a minimal amount of oxygen, there is not enough oxygen present in the composition to affect the crystal structure from that formed by the nitride. Thus, the $Ca_{1-x-y}Sr_xEu_yAlSiN_3$ is not an oxynitride phosphor. Persons skilled in this art recognize that there is no bright line or exact boundary that defines the amount of oxygen present that causes the composition to be categorized as an oxynitride rather than a nitride, but generally speaking in a nitride phosphor, only very small amounts of oxygen are present; e.g., less than five percent (5%) as compared to the amount of nitrogen present. The phosphor composition may include more than one type of phosphor having the formula of $Ca_{1-x-y}Sr_xEu_yAlSiN_3$ and/or may include other phosphors or other luminophoric compositions in combination (both within the same phosphor composition or in another composition in a device described herein) with the $Ca_{1-x-y}Sr_xEu_yAlSiN_3$.

Although the $Ca_{1-x-y}Sr_xEu_yAlSiN_3$ is not an oxynitride phosphor, in some embodiments of the invention, the $Ca_{1-x-y}Sr_xEu_yAlSiN_3$ phosphor composition includes at least 1% by weight of a separate silicon aluminum oxynitride phase. In some embodiments, the silicon aluminum oxynitride phase includes $Si_2Al_4O_4N_4$.

The phosphor may be present in any suitable form, including but not limited to particles, blocks, or other known phosphor structures. In some embodiments, the phosphor composition is present as particles having an average particle size in a range of about 2.0 µm and 25 µm. The mixture may be pulverized in conventional fashion for use as may be desired or necessary. The size of the pulverized particles depends on the end application and in most circumstances can be chosen by the end user. The particles may also be obtained in any suitable shape, including elongated, spherical and/or semispherical. In some embodiments, 50, 75 or 95% or more of the particles in the phosphor composition are elongated. In some embodiments, 50, 75 or 95% or more of the particles in the phosphor composition are spherical or substantially spherical. It has been discovered that in some embodiments, as the calcium concentration decreases, the particles may become more elongated.

In some embodiments of the present invention, phosphor compositions include $Ca_{1-x-y}Sr_xEu_yAlSiN_3$ phosphor particles, wherein x<1 and y<1, and at least some of the $Ca_{1-x-y}Sr_xEu_yAlSiN_3$ phosphor particles are elongated. In some embodiments, x is in a range of 0.5 and 0.99 and y is in a range of 0.001 and 0.025. In some embodiments, 50% or more of the $Ca_{1-x-y}Sr_xEu_yAlSiN_3$ phosphor particles are elongated, in some embodiments, 75% or more of the $Ca_{1-x-y}Sr_xEu_yAlSiN_3$ phosphor particles are elongated, and in some embodiments, 95% or more of the $Ca_{1-x-y}Sr_xEu_yAlSiN_3$ phosphor particles are elongated. Post-processing of the phosphor may also be performed, such as, for example, those methods described in U.S. Pat. No. 8,287,759, filed May 15, 2009 and U.S. Patent Application Publication No. 2012/0305958, filed Jun. 3, 2011, entitled Red Nitride Phosphors, the contents of which are incorporated herein by reference in their entirety.

Also provided according to embodiments of the invention are methods of forming phosphor compositions. In some embodiments, such methods include mixing nitrides of calcium, strontium, aluminum and silicon with a europium source composition to form a precursor mixture, and then heating the precursor mixture in the presence of forming gas to a temperature that is sufficient to produce the phosphor but less than a temperature at which the precursor compositions or the phosphor would decompose or react with the crucible. The reaction is carried out for a time sufficient to produce a phosphor composition that will down convert photons in the blue and ultraviolet regions of the spectrum (i.e., between about 430 and 480 nm) into photons in the longer-wavelength regions of the visible spectrum (i.e., between about 530 and 750 nm). Persons skilled in this art will recognize that the boundaries for colors in the visible spectrum are used descriptively rather than in a limiting sense.

In some embodiments, this heating of the precursor mixture is performed in the substantial absence of water and oxygen. In some embodiments, the precursor mixture is heated to a temperature in a range of 1500° C. and 1800° C.

As used herein, the phrase "europium source composition" refers to a composition that will produce europium as the activator cation in the crystal lattice of the phosphor under the reaction conditions set forth herein. For example, in some embodiments, europium fluoride is the europium source composition.

As used herein, the term "forming gas" refers to a mixture of nitrogen and hydrogen gas. In some embodiments, forming gas has a relatively high nitrogen content. For example, in some cases, forming gas includes nitrogen at a concentration in a range of 90% to 95% by volume, and the hydrogen is present at a concentration in a range of 5% to 10%.

In some embodiments of the invention, the mixture is heated at or near atmospheric pressure." As used herein, the term "at or near atmospheric pressure" refers to a pressure that does not require high pressure equipment.

In some embodiments, the precursor mixture is heated in a refractory crucible. In some embodiments, the refractory crucible is substantially inert in the presence of the farming gas mixture. For example, in some embodiments, the refractory crucible includes molybdenum. Synthesis of a phosphor in an inappropriate crucible material can reduce the optical performance of a phosphor. Such degradation usual results from some reaction between the crucible material and the reactants. For example, when aluminum oxide crucibles were used in reactions similar to those described herein, the oxygen from the crucible tended to be incorporated into the resulting phosphor powder which in turn demonstrated poor luminescent qualities. As examples, crucibles of tungsten (W) and molybdenum (Mo) have been determined to be advantageous in some embodiments. Tungsten and molybdenum are refractory metals; they can withstand high temperatures and are inert under the correct atmospheres.

In some embodiments of the invention, the heating steps (firing) is carried out in several steps at different temperatures with appropriate ramping in between temperatures. In some embodiments of the invention, the precursor mixture is heated at a first temperature for at least 0.5 hours, heated to a second temperature for at least 0.5 hours, and then heated to a third temperature for at least 0.5 hours. In some embodiments, the temperature is ramped at 350° C. per hour between heating steps. In some embodiments, the first temperature is 800° C., the second temperature is 1200° C. and the third temperature is 1800° C.

Any suitable method of forming the phosphor compositions may be used. However, some methods that may be useful are found in U.S. patent application Ser. No. 12/271,945, filed Nov. 17, 2008, the contents of which are hereby incorporated by reference herein in their entirety. In some embodiments, the phosphor composition is formed by the following method. FIG. 1 is a top perspective view of a relatively large alumina crucible broadly designated at 10. In some embodiments of the invention, nitrides of calcium ($Ca_3N_2$), nitrides of strontium ($Sr_2N$), nitrides of aluminum (AlN), and nitrides of silicon ($Si_3N_4$) and europium fluoride are mixed according to the target stoichiometry in a glove box (not shown) which is essentially free of water and oxygen. The powders are then loaded into the tungsten or molybdenum crucible shown as the circular crucible 11 resting on the floor 12 of the large alumina crucible 10. A gas flow tube 13 projects into the interior of the crucible 10 through the cylindrical wall 14.

Figure 2:
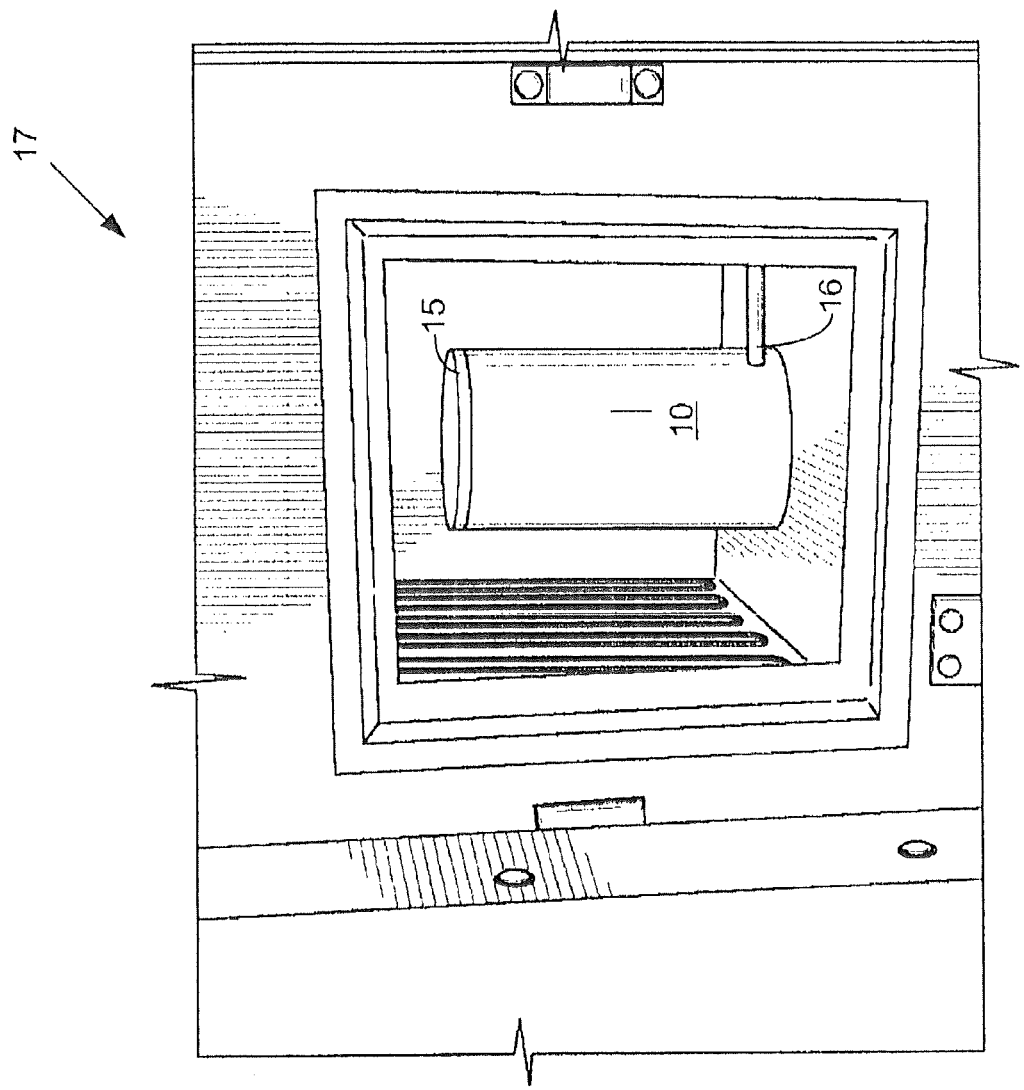
FIG. 2 shows an apparatus that may be used to form a phosphor composition according to an embodiment of the invention.
Figure 3:
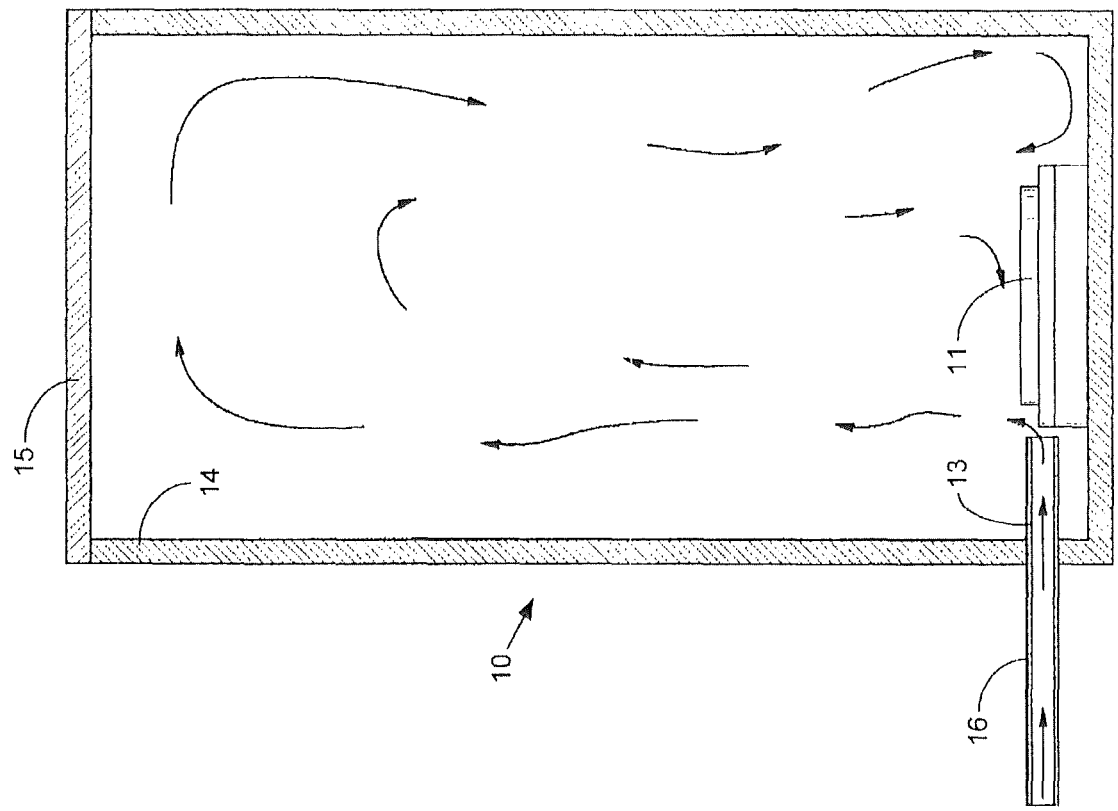
FIG. 3 shows the forming gas flow in an apparatus that may be used to form a phosphor composition according to an embodiment of the invention.

FIG. 2 shows the crucible 10 and a lid 15 and the external portion of the gas tube 16. The alumina crucible 10 is placed in a box furnace broadly designated at 17. The alumina crucible 10 is not always necessary. If the furnace itself is fitted to contain the forming gas atmosphere, the alumina crucible 10 illustrated in the drawings can be optional. The tube 16 is typically formed of a ceramic material, which is likewise selected to be unaffected by the forming gas or by any of the compositions used to form the phosphor or by the phosphor itself. The box furnace 17 is then used to heat the materials using the thermal cycle described earlier. FIG. 3 is a cross-sectional view of the alumina crucible 10 illustrating the cylindrical wall 14 and the lid 15. The ceramic tube 16, 13 extends through the wall 14 to the interior of the alumina crucible 10 and the arrows schematically illustrate the forming gas flowing over the tungsten or molybdenum crucible 11. Other configurations may be used, including whereby alumina crucible is more closely fitted around the tungsten or molybdenum crucible 11.

As shown in FIG. 3, the crucible is surrounded by a dynamic flow of forming gas (e.g., 95% $N_2$/5% $H_2$) through the use of a ceramic tub inserted into the larger alumina crucible. The box furnace is heated to 800° C. for 1 hour, then heated to 1200° C. for one hour, and then heated to 1800° C. for 2 hours. The temperature ramping rate is 350° C. per hour. This process may produce a $Ca_{1-x-y}Sr_xEu_yAlSiN_3$ phosphor composition according to an embodiment of the invention that also includes a separate phase that includes at least 1% of silicon aluminum oxynitride.

Under these conditions, the phosphor can be synthesized at or near ambient (i.e., atmospheric) pressures, thus offering significant process advantages by avoiding the need for high pressure techniques and equipment. It is believed that the substantial absence of oxygen and water, but not the complete absence, allows of the silicon aluminum oxynitride phase to form. It has been surprisingly discovered that phosphors that include this phase may have desirable optical properties.

Also provided according to embodiments of the invention are light emitting devices that include a phosphor composition described herein. As such, in some embodiments, light emitting devices include a solid state lighting source and a phosphor composition according to an embodiment of the invention.

Figure 4:
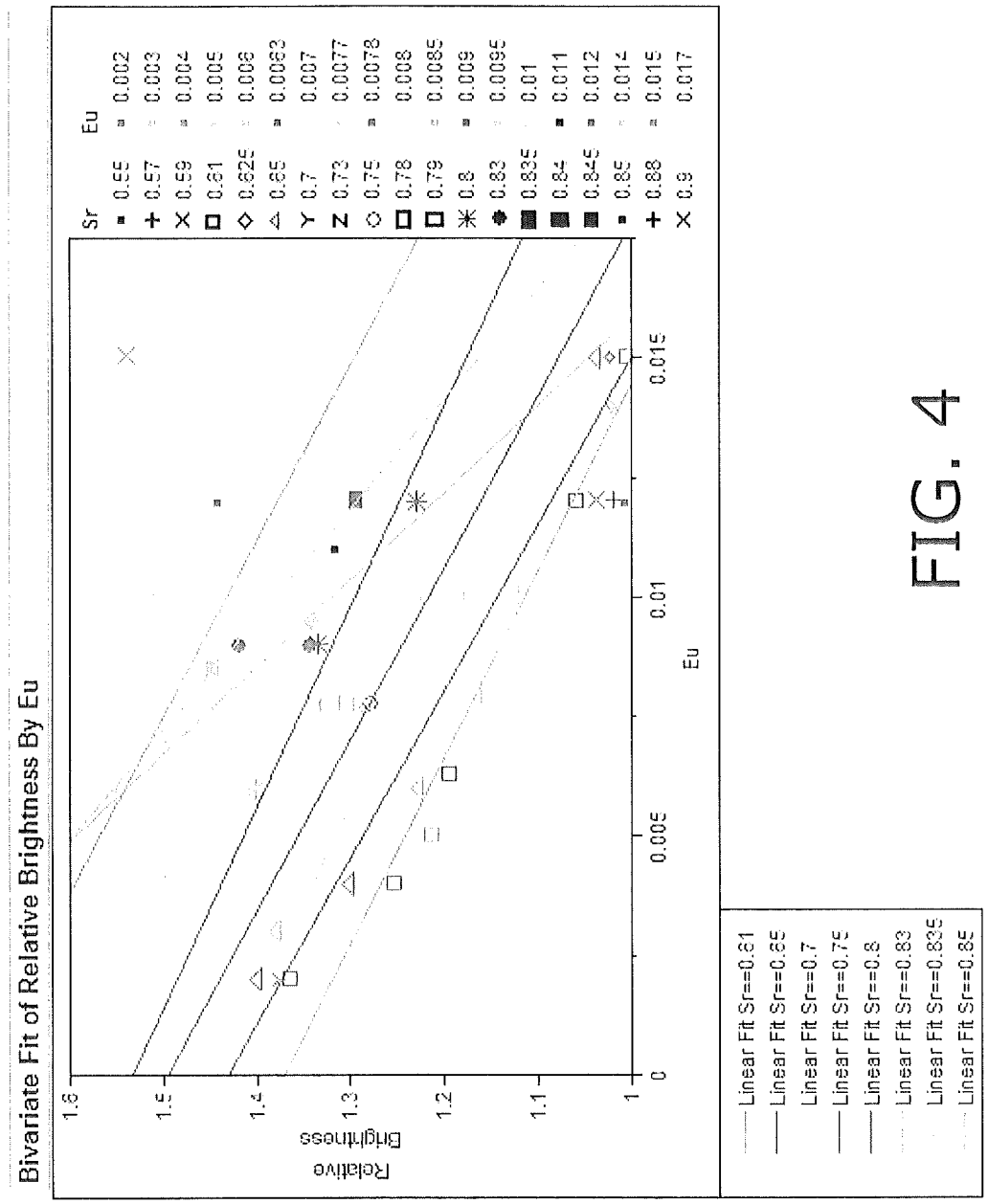
FIG. 4 illustrates the variation in relative brightness for phosphor compositions according to some embodiments of the present invention.
Figure 5:
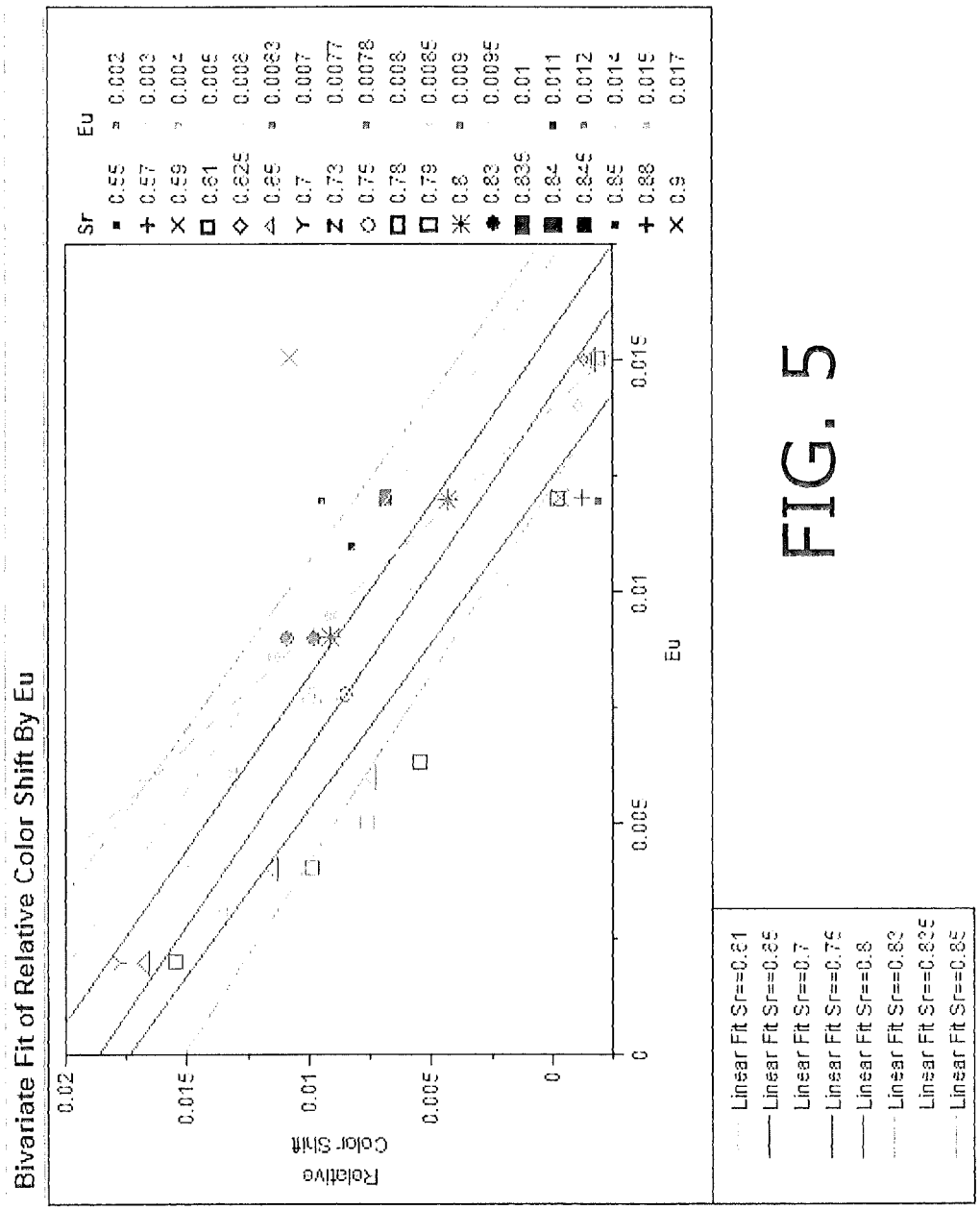
FIG. 5 illustrates the variation in relative color shift for phosphor compositions according to some embodiments of the present invention.
Figure 6:
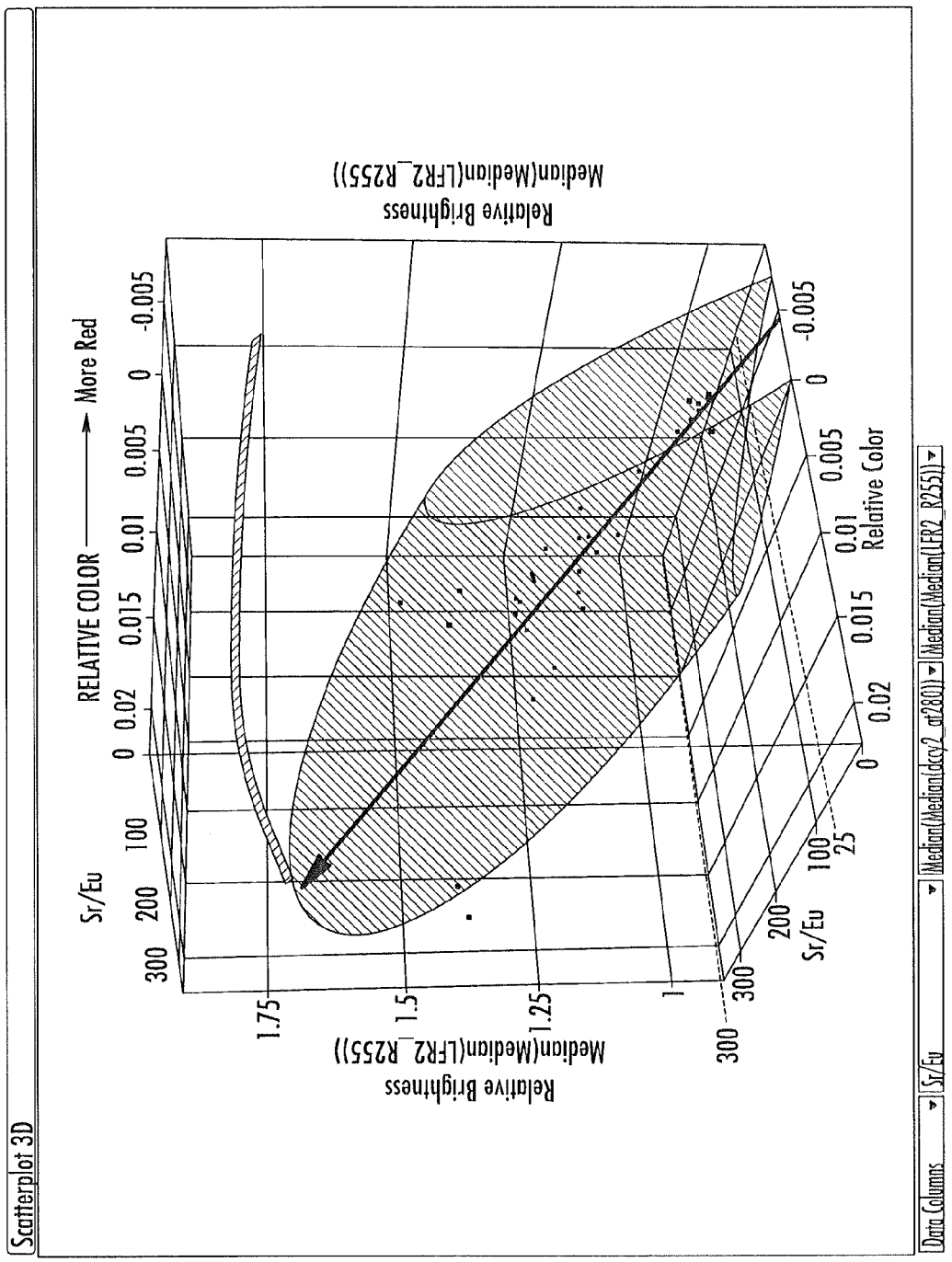
FIG. 6 provides a three dimensional graph showing the variation in relative color and relative brightness as a function of the Sr to Eu ratio for phosphor compositions according to some embodiments of the present invention. The arrow within the shaded region is provided to guide the eye in the third dimension.
Figure 7A:
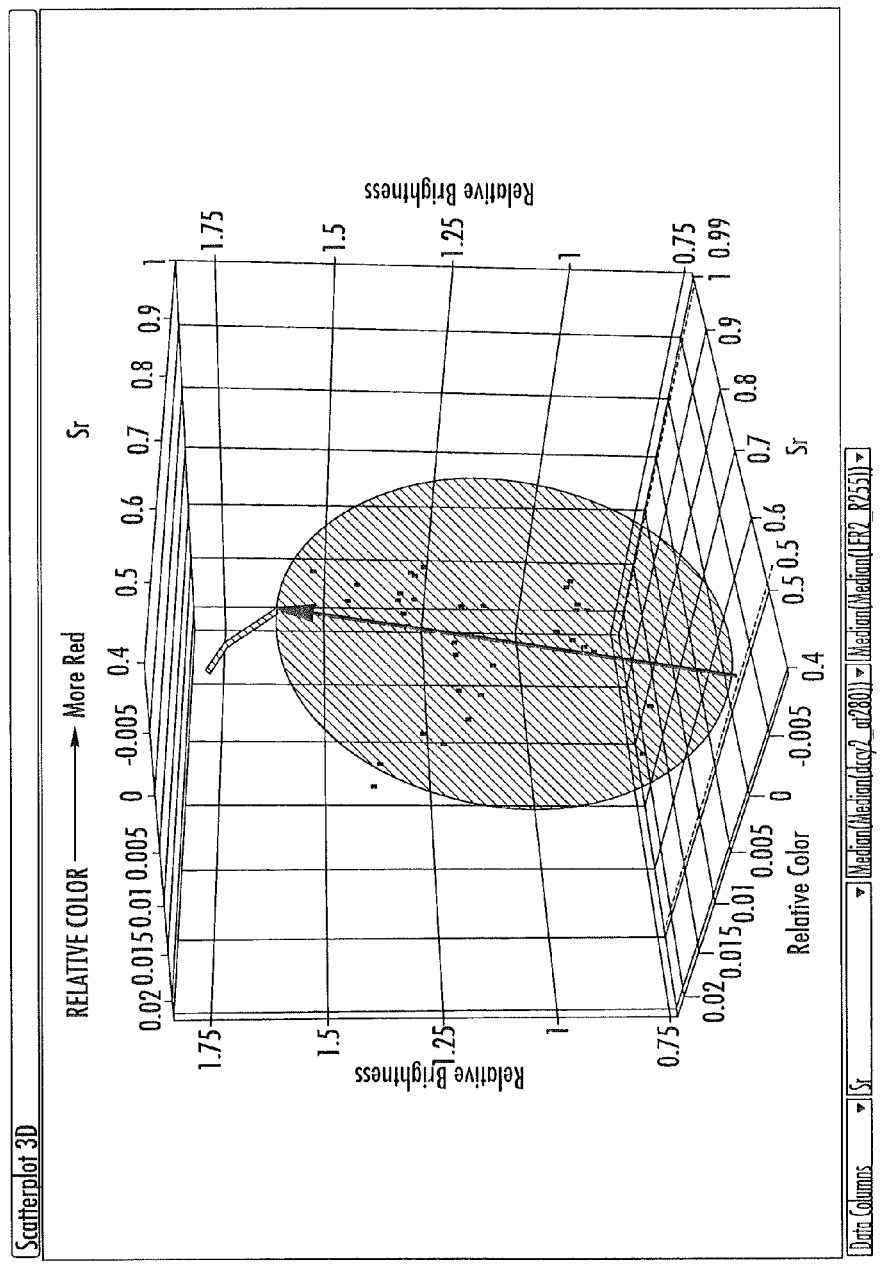
FIG. 7A provides a three dimensional graph showing the variation in relative color and relative brightness as a function of the Sr concentration for phosphor compositions according to some embodiments of the present invention. The arrow within the shaded region is provided to guide the eye in the third dimension.
Figure 7B:
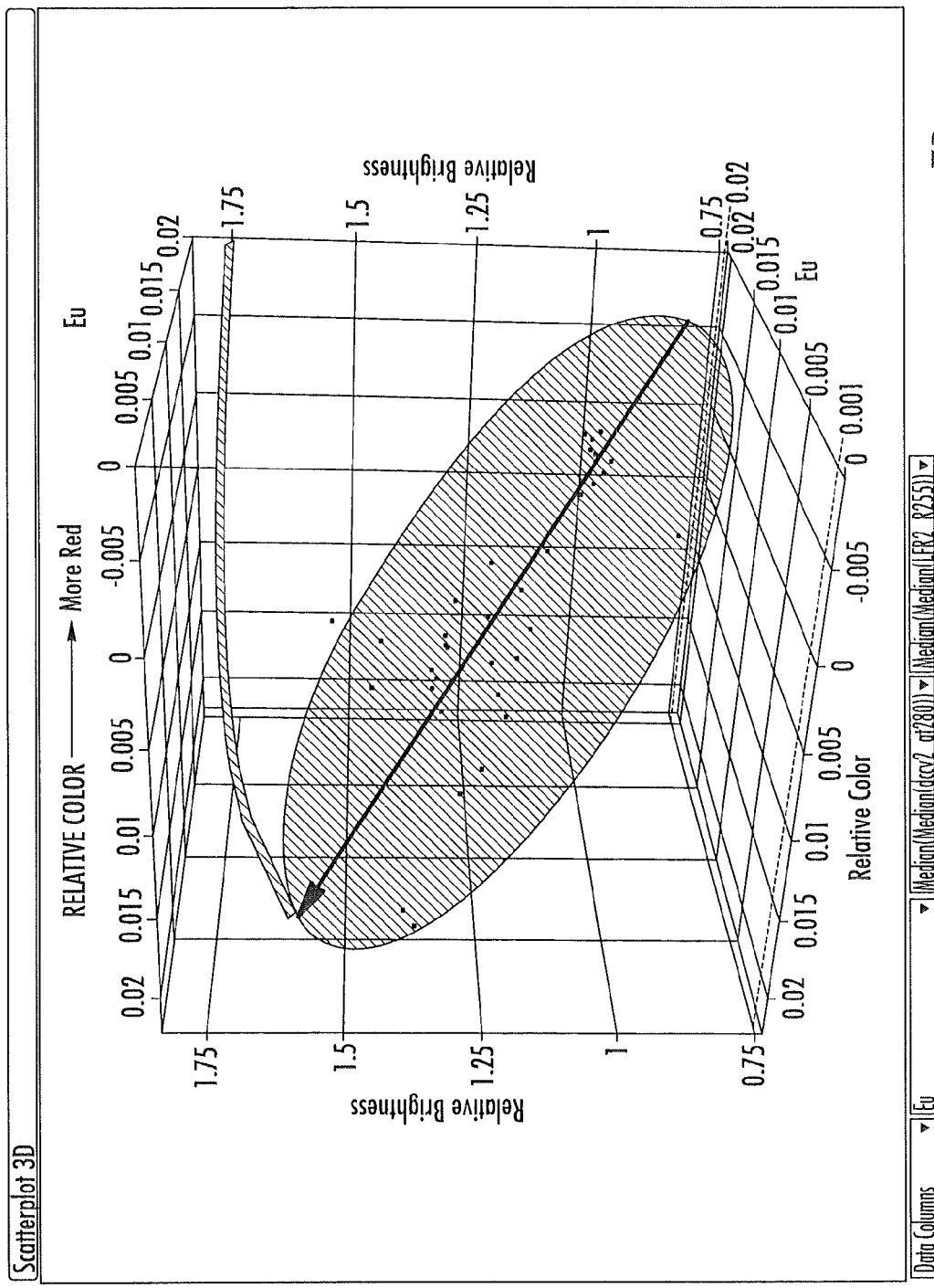
FIG. 7B provides a three dimensional graph showing the variation in relative color and relative brightness as a function of the Eu concentration for phosphor compositions according to some embodiments of the present invention. The arrow within the shaded region is provided to guide the eye in the third dimension.

FIGS. 4 and 5 provide graphs of relative brightness and relative color as a function of the europium and strontium concentration for phosphors according to embodiments of the present invention. It has surprisingly been discovered that for a given Sr concentration, as the europium concentration decreases, the brightness and color shift increases. Additionally, for a given Eu concentration, as the Sr concentration increases, the brightness and color shift increase. FIG. 6 shows the variation in relative brightness and relative color as a function of the Sr to Eu ratio. As the Sr to Eu ratio is increased, the relative brightness also increases. FIG. 7A shows the variation in relative brightness and relative color as a function of the Sr concentration. FIG. 7B shows the variation in relative brightness and relative color as a function of the Eu concentration. This is discussed further in U.S. Patent Application Publication No. 2012/0306355, filed Jun. 3, 2011 entitled Methods of Determining and Making Red Nitride Phosphor Compositions, the contents of which are incorporated herein by reference in their entirety.

Figure 8A:
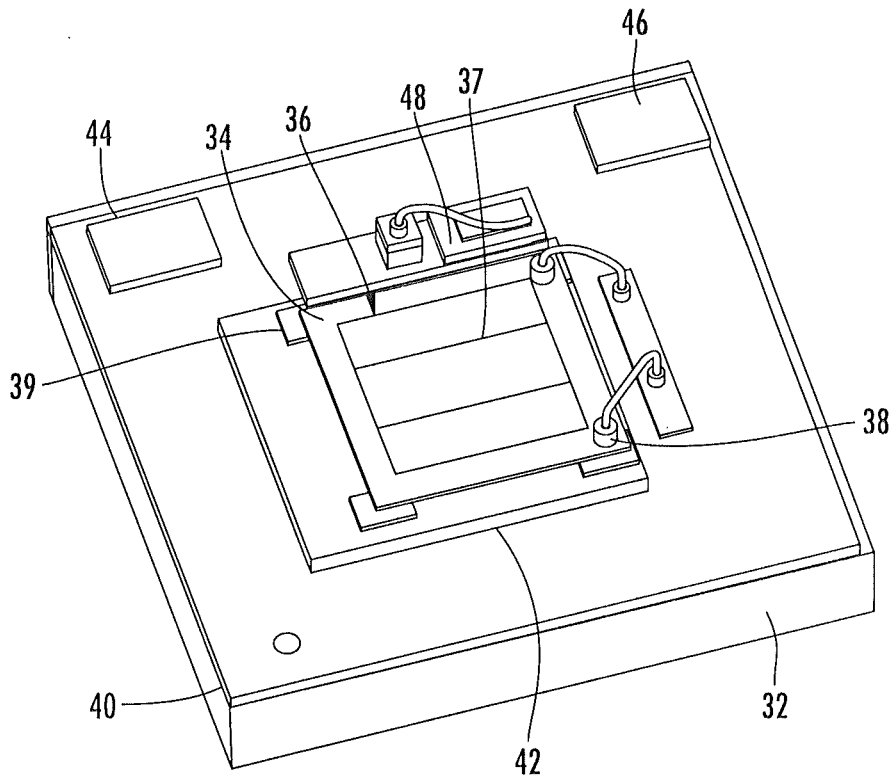
FIGS. 8A-8D are various views of a solid state light emitting device according to embodiments of the present invention.
Figure 8B:
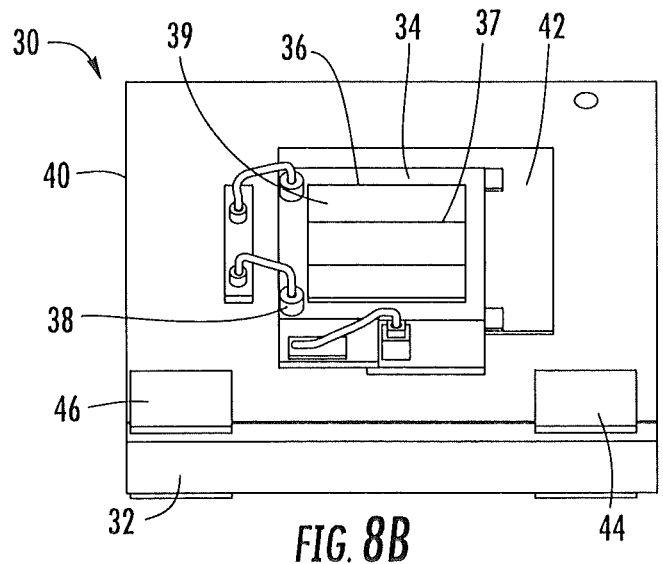
Figure 8C:
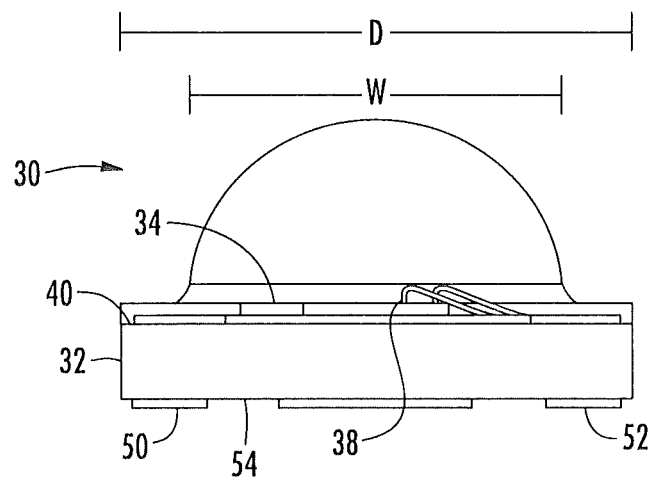
Figure 8D:
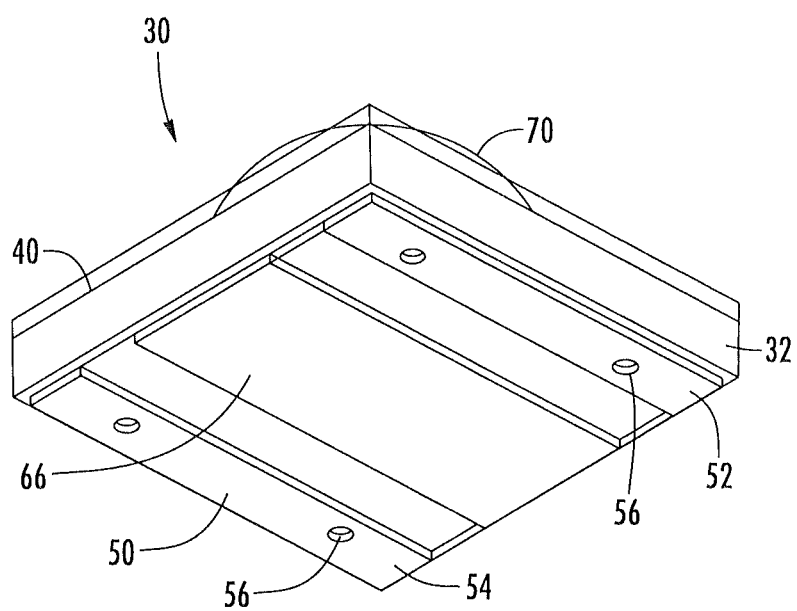

A solid state light emitting device 30 will now be described that includes a phosphor composition according to embodiments of the present invention with reference to FIGS. 8A-8D. The solid state light emitting device 30 comprises a packaged LED. In particular, FIG. 8A is a perspective view of the solid state light emitting device 30 without a lens thereof. FIG. 8B is a perspective view of the device 30 viewed from the opposite side. FIG. 8C is a side view of the device 30 with a lens covering the LED chip. FIG. 8D is a bottom perspective view of the device 30.

As shown in FIG. 8A, the solid state light emitting device 30 includes a substrate/submount ("submount") 32 on which a single LED chip or "die" 34 is mounted. The submount 32 can be formed of many different materials such as, for example, aluminum oxide, aluminum nitride, organic insulators, a printed circuit board (PCB), sapphire or silicon. The LED 34 can have many different semiconductor layers arranged in different ways. LED structures and their fabrication and operation are generally known in the art and hence are only briefly discussed herein. The layers of the LED 34 can be fabricated using known processes such as, for example, metal organic chemical vapor deposition (MOCVD). The layers of the LED 34 may include at least one active layer/region sandwiched between first and second oppositely doped epitaxial layers all of which are formed successively on a growth substrate. Typically, many LEDs are grown on a growth substrate such as, for example, a sapphire, silicon carbide, aluminum nitride (AlN), or gallium nitride (GaN) substrate to provide a grown semiconductor wafer, and this wafer may then be singulated into individual LED dies, which are mounted in a package to provide individual packaged LEDs. The growth substrate can remain as part of the final singulated LED or, alternatively, the growth substrate can be fully or partially removed. In embodiments where the growth substrate remains, it can be shaped and/or textured to enhance light extraction.

It is also understood that additional layers and elements can also be included in the LED 34, including but not limited to buffer, nucleation, contact and current spreading layers as well as light extraction layers and elements. It is also understood that the oppositely doped layers can comprise multiple layers and sub-layers, as well as super lattice structures and interlayers. The active region can comprise, for example, a single quantum well (SQW), multiple quantum well (MQW), double heterostructure or super lattice structure. The active region and doped layers may be fabricated from different material systems, including, for example, Group-III nitride based material systems such as GaN, aluminum gallium nitride (AlGaN), indium gallium nitride (InGaN) and/or aluminum indium gallium nitride (AlInGaN). In some embodiments, the doped layers are GaN and/or AlGaN layers, and the active region is an InGaN layer.

The LED 34 may be an ultraviolet, violet or blue LED that emits radiation with a dominant wavelength in a range of about 380 to about 475 nm.

The LED 34 may include a conductive current spreading structure 36 on its top surface, as well as one or more contacts 38 that are accessible at its top surface for wire bonding. The spreading structure 36 and contacts 38 can both be made of a conductive material such as Au, Cu, Ni, In, Al, Ag or combinations thereof, conducting oxides and transparent conducting oxides. The current spreading structure 36 may comprise conductive fingers 37 that are arranged in a pattern on the LED 34 with the fingers spaced to enhance current spreading from the contacts 38 into the top surface of the LED 34. In operation, an electrical signal is applied to the contacts 38 through a wire bond as described below, and the electrical signal spreads through the fingers 37 of the current spreading structure 36 into the LED 34. Current spreading structures are often used in LEDs where the top surface is p-type, but can also be used for n-type materials.

The LED 34 may be coated with a phosphor composition 39 according to embodiments of the present invention. It will be understood that the phosphor composition 39 may comprise any of the phosphor compositions discussed in the present disclosure.

The phosphor composition 39 may be coated on the LED 34 using many different methods, with suitable methods being described in U.S. Patent Application Publication Nos. 2008/0179611 and 2008/0173884, both entitled Wafer Level Phosphor Coating Method and Devices Fabricated Utilizing Method. Alternatively the phosphor composition 39 may be coated on the LED 34 using other methods such an electrophoretic deposition (EPD), with a suitable EPD method described in U.S. Pat. No. 8,563,339 entitled Closed Loop Electrophoretic Deposition of Semiconductor Devices. One exemplary method of coating the phosphor composition 39 onto the LED 34 is described herein with reference to FIGS. 9A-9E.

An optical element or lens 70 (see FIGS. 8C-8D) is formed on the top surface 40 of the submount 32, over the LED 34, to provide both environmental and/or mechanical protection. The lens 70 can be molded using different molding techniques such as those described in U.S. patent application Ser. No. 11/982,275 entitled Light Emitting Diode Package and Method for Fabricating Same. The lens 70 can be many different shapes such as, for example, hemispheric. Many different materials can be used for the lens 70 such as silicones, plastics, epoxies or glass. The lens 70 can also be textured to improve light extraction and/or scattering particles. In some embodiments, the lens 70 may comprise the phosphor composition 39 and/or may be used to hold a phosphor composition 39 in place over the LED 34 instead of and/or in addition to coating a phosphor composition 39 directly onto the LED chip 34.

The solid state light emitting device 30 may comprise an LED package having different sizes or footprints. In some embodiments, the surface area of the LED chip 34 may cover more than 10% or even 15% of the surface area of the submount 32. In some embodiments, the ratio of the width W of the LED chip 34 to the diameter D (or width D, for square lens) of the lens 70 may be greater than 0.5. For example, in some embodiments, the solid state light emitting device 30 may comprise an LED package having a submount 32 that is approximately 3.45 mm square and a hemispherical lens having a maximum diameter of approximately 2.55 mm. The LED package may be arranged to hold an LED chip that is approximately 1.4 mm square. In this embodiment, the surface area of the LED chip 34 covers more than 16% of the surface area of the submount 32.

The top surface 40 of the submount 32 may have patterned conductive features that can include a die attach pad 42 with an integral first contact pad 44. A second contact pad 46 is also included on the top surface 40 of the submount 32 with the LED 34 mounted approximately at the center of the attach pad 42. The attach pad 42 and first and second contact pads 44, 46 may comprise metals or other conductive materials such as, for example, copper. The copper pads 42, 44, 46 may be plated onto a copper seed layer that is, in turn, formed on a titanium adhesion layer. The pads 42, 44, 46 may be patterned using standard lithographic processes. These patterned conductive features provide conductive paths for electrical connection to the LED 34 using known contacting methods. The LED 34 can be mounted to the attach pad 42 using known methods and materials.

A gap 48 (see FIG. 8A) is included between the second contact pad 46 and the attach pad 42 down to the surface of the submount 32. An electrical signal is applied to the LED 34 through the second pad 46 and the first pad 44, with the electrical signal on the first pad 44 passing directly to the LED 34 through the attach pad 42 and the signal from the second pad 46 passing into the LED 34 through wire bonds. The gap 48 provides electrical isolation between the second pad 46 and attach pad 42 to prevent shorting of the signal applied to the LED 34.

Referring to FIGS. 8C and 8D, an electrical signal can be applied to the package 30 by providing external electrical contact to the first and second contact pads 44, 46 via first and second surface mount pads 50, 52 that are formed on the back surface 54 of the submount 32 to be at least partially in alignment with the first and second contact pads 44, 46, respectfully. Electrically conductive vias 56 are formed through the submount 32 between the first mounting pad 50 and the first contact pad 44, such that a signal that is applied to the first mounting pad 50 is conducted to first contact pad 44. Similarly, conductive vias 56 are formed between the second mounting pad 52 and second contact pad 46 to conduct an electrical signal between the two. The first and second mounting pads 50, 52 allow for surface mounting of the LED package 30 with the electrical signal to be applied to the LED 34 applied across the first and second mounting pads 50, 52.

The pads 42, 44, 46 provide extending thermally conductive paths to conduct heat away from the LED 34. The attach pad 42 covers more of the surface of the submount 32 than the LED 34, with the attach pad extending from the edges of the LED 34 toward the edges of the submount 32. The contact pads 44, 46 also cover the surface of the submount 32 between the vias 56 and the edges of the submount 32. By extending the pads 42, 44, 46, the heat spreading from the LED 34 may be improved, which may improve the operating life of the LED and/or allow for higher operating power.

The LED package 30 further comprises a metalized area 66 on the back surface 54 of the submount 32, between the first and second mounting pads 50, 52. The metalized area 66 may be made of a heat conductive material and may be in at least partial vertical alignment with the LED 34. In some embodiments, the metalized area 66 is not in electrical contact with the elements on top surface of the submount 32 or the first and second mounting pads 50, 52 on the back surface of the submount 32. Although heat from the LED is spread over the top surface 40 of the submount 32 by the attach pad 42 and the pads 44, 46, more heat will pass into the submount 32 directly below and around the LED 34. The metalized area 66 can assist with this dissipation by allowing this heat to spread into the metalized area 66 where it can dissipate more readily. The heat can also conduct from the top surface 40 of the submount 32, through the vias 56, where the heat can spread into the first and second mounting pads 50, 52 where it can also dissipate.

It will be appreciated that FIGS. 8A-8D illustrate one exemplary packaged LED that may include phosphor compositions according to embodiments of the present invention. Additional exemplary packaged LEDs are disclosed in, for example, U.S. Provisional Patent Application No. 61/173,550, filed Apr. 28, 2009, the entire contents of which are incorporated by reference herein as if set forth in its entirety. It will likewise be appreciated that the phosphor compositions according to embodiments of the present invention may be used with any other packaged LED structures.

As noted above, in some embodiments, the phosphor compositions according to embodiments of the present invention may be directly coated onto a surface of a semiconductor wafer before the wafer is singulated into individual LED chips. One such process for applying the phosphor composition will now be discussed with respect to FIGS. 9A-9E. In the example of FIGS. 9A-9E, the phosphor composition is coated onto a plurality of LED chips 110. In this embodiment, each LED chip 110 is a vertically-structured device that has a top contact 124 and a bottom contact 122.

Referring to FIG. 9A, a plurality of LED chips 110 (only two are shown) are shown at a wafer level of their fabrication process (i.e., before the wafer has been separated/singulated into individual LED chips). Each of the LED chips 110 comprises a semiconductor LED that is formed on a substrate 120. Each of the LED chips 110 has first and second contacts 122, 124. The first contact 122 is on the bottom of the substrate 120 and the second contact 124 is on the top of the LED chip 110. In this particular embodiment, the top contact 124 is a p-type contact and the contact 122 on the bottom of the substrate 120 is an n-type contact. However, it will be appreciated that in other embodiments, the contacts 122, 124 may be arranged differently. For example, in some embodiments, both the contact 122 and the contact 124 may be formed on an upper surface of the LED chip 110.

As shown in FIG. 9B, a conductive contact pedestal 128 is formed on the top contact 124 that is utilized to make electrical contact to the p-type contact 124 after the LED chips 110 are coated with a phosphor composition. The pedestal 128 can be formed of many different electrically conductive materials and can be formed using many different known physical or chemical deposition processes such as electroplating, mask deposition (e-beam, sputtering), electroless plating, or stud bumping. The height of the pedestal 128 can vary depending on the desired thickness of the phosphor composition and should be high enough to match or extend above the top surface of the phosphor composition coating from the LED.

As shown in FIG. 9C, the wafer is blanketed by a phosphor composition coating 132 that covers each of the LED chips 110, the contacts 122, and the pedestal 128. The phosphor composition coating 132 may comprise a binder and a phosphor composition according to an embodiment of the invention. The material used for the binder may be a material that is robust after curing and substantially transparent in the visible wavelength spectrum such as, for example, a silicone, epoxy, glass, inorganic glass, spin-on glass, dielectrics, BCB, polymides, polymers and the like. The phosphor composition coating 132 can be applied using different processes such as spin coating, dispensing, electrophoretic deposition, electrostatic deposition, printing, jet printing or screen printing. Yet another suitable coating technique is disclosed in U.S. patent application Ser. No. 12/717,048, filed Mar. 3, 2010, the contents of which are incorporated herein by reference. The phosphor composition coating 132 can then be cured using an appropriate curing method (e.g., heat, ultraviolet (UV), infrared (IR) or air curing).

Different factors determine the amount of LED light that will be absorbed by the phosphor composition coating 132 in the final LED chips 110, including but not limited to the size of the phosphor particles, the percentage of phosphor loading, the type of binder material, the efficiency of the match between the type of phosphor and wavelength of emitted light, and the thickness of the phosphor composition coating 132. It will be understood that many other phosphors can used alone or in combination to achieve the desired combined spectral output.

Different sized phosphor particles can be used including, but not limited to, 10-100 nanometer (nm)-sized particles to 20-30 µm sized particles, or larger. Smaller particle sizes typically scatter and mix colors better than larger sized particles to provide a more uniform light. Larger particles are typically more efficient at converting light compared to smaller particles, but emit a less uniform light. In some embodiments, the phosphor particles may range in size from about 1 micron to about 30 microns, with about half of the particles being from between about 4 microns to about 20 microns. In some embodiments, at least half of the particles of the phosphors may have a size (diameter) in the range between 2 microns and 20 microns. Different sized phosphors can be included in the phosphor composition coating 132 as desired before it is applied such that the end coating 132 can have the desired combination of smaller sizes to effectively scatter and mix the light, and larger sizes to efficiently convert the light.

The coating 132 can also have different concentrations or loading of phosphor materials in the binder, with a typical concentration being in range of 30-70% by weight. In one embodiment, the phosphor concentration is approximately 65% by weight, and is may be generally uniformly dispersed throughout the binder. In other embodiments the coating 132 can comprise multiple layers of different concentrations or types of phosphors, and the multiple layers can comprise different binder materials. One or more of the layers can be provided without phosphors. For example, a first coat of clear silicone can be deposited followed by phosphor loaded layers. As another example, the coating may comprise, for example, a two layer coating that includes a first layer having one type of phosphor on the LED chips 110, and a second layer directly on the first layer that includes a second type of phosphor. Numerous other layer structures are possible, including multi-layers that include multiple phosphors in the same layer, and intervening layers or elements could also be provided between layers and/or between the coating and the underlying LED chips 110.

After the initial coating of the LED chips 110 with the phosphor composition coating 132, further processing is needed to expose the pedestal 128. Referring now the FIG. 9D, the coating 132 is thinned or planarized to expose the pedestals 128 through the top surface of the coating 132. The thinning process exposes the pedestals 128, planarizes the coating 132 and allows for control of the final thickness of the coating 132. Based on the operating characteristics of the LEDs 110 across the wafer and the properties of the phosphor (or fluorescent) material selected, the end thickness of the coating 132 can be calculated to reach a desired color point/range and still expose the pedestals 128. The thickness of the coating 132 can be uniform or non-uniform across the wafer.

Any suitable coating thickness may be used. However, in some embodiments, the coating is less than 1 µm, in some embodiments, less than 500 µm, in some embodiments, less than 100 µm, in some embodiments, less than 10 µm.

As shown in FIG. 9E, after the coating 132 is applied, the individual LED chips 110 can be singulated from the wafer using known methods such as dicing, scribe and breaking, or etching. The singulating process separates each of the LED chips 110 with each having substantially the same thickness of coating 132, and as a result, substantially the same amount of phosphor and thus substantially the same emission characteristics. Following singulation of the LED chips 110, a layer of coating 132 remains on the side surfaces of the LEDs 110 and light emitting from the side surfaces of the LEDs 110 also passes through the coating 132 and its phosphor particles. This results in conversion of at least some of the side emitting light, which can provide LED chips 110 having more consistent light emitting characteristics at different viewing angles.

Following singulation, the LED chips 110 can be mounted in a package, or to a submount or printed circuit board (PCB) without the need for further processing to add phosphor. In one embodiment the package/submount/PCB can have conventional package leads with the pedestals 128 electrically connected to the leads. A conventional encapsulation can then surround the LED chip 110 and electrical connections.

While the above coating process provides one exemplary method of fabricating the solid state light emitting devices according to embodiments of the present invention that include an LED and a phosphor composition, it will be appreciated that numerous other fabrication methods are available. For example, U.S. patent application Ser. No. 11/899,790, filed Sep. 7, 2007 (U.S. Patent Application Publication No. 2008/0179611), the entire contents of which are incorporated herein by reference, discloses various additional methods of coating a phosphor composition coating onto a solid state light emitting device. In still other embodiments, light emitting devices an LED chip that may be mounted on a reflective cup by means of a solder bond or conductive epoxy, and the phosphor composition may comprise an encapsulant material such as, for example, silicone that has the phosphors suspended therein. This phosphor composition may be used, for example, to partially or completely fill the reflective cup. Thus, the phosphor may be on the LED or may be remote and optically coupled to the LED.

It is understood that although the present invention has been described with respect to LEDs having vertical geometries, it may also be applied to LEDs having other geometries such as, for example, to lateral LEDs that have both contacts on the same side of the LED chip.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While embodiments of the present invention have primarily been discussed above with respect to solid state light emitting devices that include LEDs, it will be appreciated that according to further embodiments of the present invention, laser diodes and/or other solid state lighting devices may be provided that include the phosphor compositions discussed above. Thus, it will be appreciated that embodiments of the present invention are not limited to LEDs, but may include other solid state lighting devices such as laser diodes.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device, comprising:
   a solid state lighting source; and
   a phosphor composition that comprises $Ca_{1-x-y}Sr_xEu_y$-$AlSiN_3$, wherein x is in a range of 0.50 to 0.99 and y is less than 0.013, and
   wherein the light emitting device has a CRI value of greater than 90.

2. The light emitting device of claim 1, comprising emission of a warm white light having a correlated color temperature between about 2700K and 5400K.

3. The light emitting device of claim 1, wherein the Sr to Eu ratio in the phosphor composition is in a range of 25 to 300.

4. The light emitting device of claim 1, wherein the phosphor composition is present in particulate form and at least 95% of the particles are elongated.

5. The light emitting device of claim 1, wherein the phosphor composition is present as particles having an average particle size in a range of 4 μm to 20 μm.

6. The light emitting device of claim 1, wherein the phosphor composition is present as a single crystal.

7. The light emitting device of claim 1, further comprising a green and/or yellow phosphor.

8. The light emitting device of claim 1, wherein the phosphor composition comprises at least 1% by weight of silicon aluminum oxynitride.

9. A light emitting device, comprising:
   a solid state lighting source; and
   a phosphor composition that comprises $Ca_{1-x-y}Sr_xEu_y$-$AlSiN_3$, wherein x is in a range of 0.70 to 0.99 and y is in a range of 0.001 to 0.025, and
   wherein the light emitting device has a CRI value of greater than 90.

10. The light emitting device of claim 9, comprising emission of a warm white light having a correlated color temperature between about 2700K and 5400K.

11. The light emitting device of claim 9, wherein the Sr to Eu ratio in the phosphor composition is in a range of 25 to 300.

12. The light emitting device of claim 9, wherein the phosphor composition is present in particulate form and at least 95% of the particles are elongated.

13. The light emitting device of claim 9, wherein the phosphor composition is present as particles having an average particle size in a range of 4 μm to 20 μm.

14. The light emitting device of claim 9, wherein the phosphor composition is present as a single crystal.

15. The light emitting device of claim 9, further comprising a green and/or yellow phosphor.

16. The light emitting device of claim 9, wherein the phosphor composition comprises at least 1% by weight of silicon aluminum oxynitride.

* * * * *